United States Patent
Dent (10) Patent No.: US 7,039,852 B2
(45) Date of Patent: May 2, 2006

(54) CONVOLUTIONAL ENCODING USING A MODIFIED MULTIPLIER

(75) Inventor: Peter R. Dent, Irthlingborough (GB)

(73) Assignee: Texas Instruments Incorporated, Dallas, TX (US)

( * ) Notice: Subject to any disclaimer, the term of this patent is extended or adjusted under 35 U.S.C. 154(b) by 239 days.

(21) Appl. No.: 10/135,811

(22) Filed: Apr. 29, 2002

(65) Prior Publication Data

US 2003/0120994 A1 Jun. 26, 2003

(30) Foreign Application Priority Data

Dec. 20, 2001 (EP) ................................. 01310694

(51) Int. Cl.
*H03M 13/03* (2006.01)
(52) U.S. Cl. ...................... 714/781; 714/786
(58) Field of Classification Search ............. 714/781, 714/786
See application file for complete search history.

(56) References Cited

U.S. PATENT DOCUMENTS 3,678,469 A * 7/1972 Freeman et al. ............ 714/779
4,598,382 A 7/1986 Sato
6,751,773 B1 * 6/2004 Okabayashi et al. ........ 714/786
2001/0023497 A1 * 9/2001 Seki ........................... 714/784

OTHER PUBLICATIONS

Technical Specification Group Radio Access Network; Multiplexing and Channel Coding (FDD) (Release 1999), "3G TS 25.212 V3.3.0" (Jun. 2000), WWW.3GPP.Org, XP-002202956.

* cited by examiner

*Primary Examiner*—Joseph Torres
(74) *Attorney, Agent, or Firm*—Ronald O. Neerings; Wade James Brady, III; Frederick J. Telecky, Jr.

(57) ABSTRACT

A wireless communications device is disclosed, in which certain digital coding functions are realized according to a modified multiplier architecture. The device includes an encode and modulate function within which convolutional coding function is provided. The convolutional coding function may be realized as a modified parallel multiplier, in which carries among adder units are ignored or not generated. The datastream is applied to the multiplier as the multiplicand, while successive sets of code generator polynomial coefficients are applied as a multiplier. Carry-in and carry-out bits among the adder units are blocked in a coding mode, but passed in a multiplier mode. A similar arrangement of a modified parallel multiplier circuit may be used in generating a scrambling code that is applied prior to transmission.

13 Claims, 8 Drawing Sheets

CONVOLUTIONAL ENCODING USING A MODIFIED MULTIPLIER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of wireless communications, and is more specifically directed to the digital coding and modulation of broadband signals in such communications.

The popularity of mobile wireless communications has increased dramatically over recent years. It is expected that this technology will become even more popular in the foreseeable future, both in modem urban settings and also in rural or developing regions that are not well served by line-based telephone systems. This increasing wireless traffic strains the available communications bandwidth for a given level of system infrastructure. As a result, there is substantial interest in increasing bandwidth utilization of wireless communications system to handle this growth in traffic.

This trend toward heavier usage of wireless technologies for communications, in combination with the advent of so-called third-generation, or "3G", wireless communications to carry not only voice, but also data, video, and other high data rate payloads, will require continuing improvements in the processing capabilities of the communications equipment. In particular, the higher required data rates will require corresponding increases in the digital processing of the communications payloads.

Modern digital communications technology utilizes multiple-access techniques to increase bandwidth utilization, and thus to carry more wireless traffic. Under current approaches, both time division multiple access (TDMA) and code division multiple access (CDMA) techniques are used in the art to enable the simultaneous operation of multiple communication sessions, or wireless "connections", each involving voice communications, data communications, or any type of digital payload. As evident from the name, TDMA communications are performed by the assignment of time slots to each of multiple communications, with each conversation transmitted alternately over short time periods. CDMA technology, on the other hand, permits multiple communication sessions to be transmitted simultaneously in both time and frequency, by modulating the signal with a specified code. On receipt, application of the code will recover the corresponding conversation, to the exclusion of the other simultaneously received conversations.

In both TDMA and CDMA communications, according to conventional and expected next-generation approaches, digital coding is applied for various purposes. An example of a typical digital code is convolutional coding, which inserts redundancy into the digital word stream being transmitted. In broadband communications, successive digital words in the transmitted digital datastream are effectively split into multiple subchannels, each subchannel being separately spread and encoded. Convolutional coding is applied to each subchannel, with the inserted redundancy providing the ability of forward error correction at the receiver. This convolutional coding thus effectively increases the signal-to-noise ratio of the wireless transmission.

Figure 1:
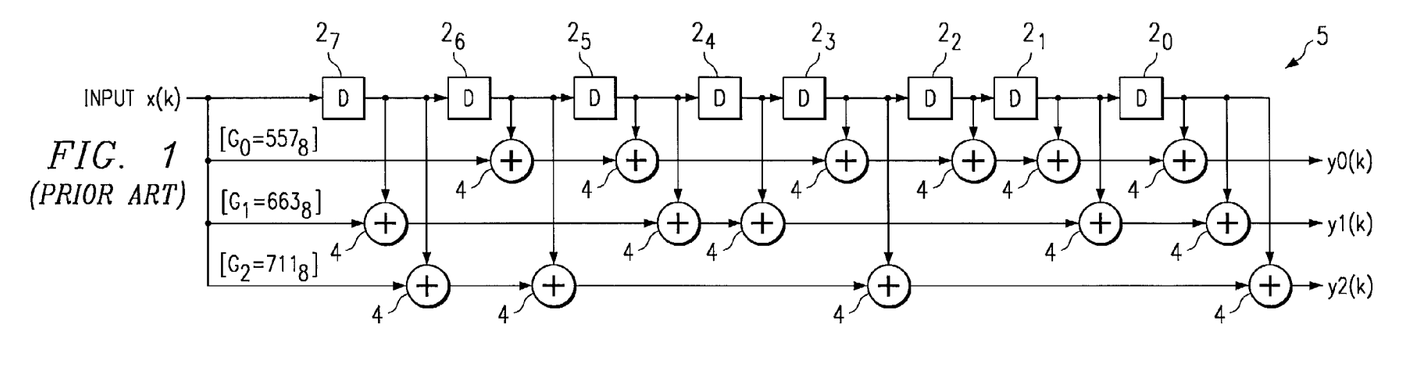
FIG. 1 is an electrical diagram, in block form, of a conventional convolutional coding circuit.

FIG. 1 illustrates convolutional coder 5, constructed according to conventional techniques, and which in this example is based on the 3GPP 25.212 third-generation standard. In convolutional coder 5 of FIG. 1, the code rate is 1/3, considering that the input bitstream x(k) applies single bits, and that three output bitstreams y0(k), y1(k), y2(k) are generated. The constraint length of this example is nine, considering the eight delay stages $2_7$ through $2_0$. The current state of input x(k) and the eight previous states of input x(k) are used to produce the output bitstreams y0(k), y1(k), y2(k). As shown in FIG. 1, convolutional coder 5 also includes exclusive-OR functions 4, arranged to implement the desired convolutional code. Each exclusive-OR function 4 has an input from one of delay stages 2, and an input from a previous exclusive-OR function 4 (or directly from input x(k)).

The positions of the exclusive-OR functions 4 determine the code generator polynomials $G_0$, $G_1$, $G_2$ that generate the outputs y0(k), y1(k), y2(k), respectively. According to the conventional nomenclature, the convolutional code of FIG. 1 is referred to as K=9, ($557_8$, $663_8$, $711_8$), with generator polynomials $G_0=557_8$, $G_1=663_8$, and $G_2=711_8$. Outputs y0(k), y1(k), y2(k) are presented once per cycle, and thus produce a three bit sequence that is representative of a corresponding input bit x(k), and that includes redundant information from which forward error correction techniques can recover the true signal from a corrupted received transmission.

As shown in FIG. 1, convolutional coder 5 can be implemented by way of a shift register containing delay stages 2, and combinatorial logic for realizing exclusive-OR functions 4. However, in such an implementation, either the convolutional code must be hard-wired into convolutional coder 5, or alternatively the placement of a selectable exclusive-OR function 4 for each delay stage output and each generator polynomial (e.g., twenty-four functions 4 in convolutional coder 5 of FIG. 1), must be implemented. Such an architecture may turn out to be costly, yet with limited performance.

Another type of coding performed in conventional digital wireless communications is the application of a scrambling code. As currently used, this scrambling code is a cell-specific sequence that is applied to the encoded data stream in a wireless communication. The receiving element, with knowledge of the cell-specific code, can thus distinguish communications in its cell from those that are received from wireless units in physically neighboring cells.

Figure 2:
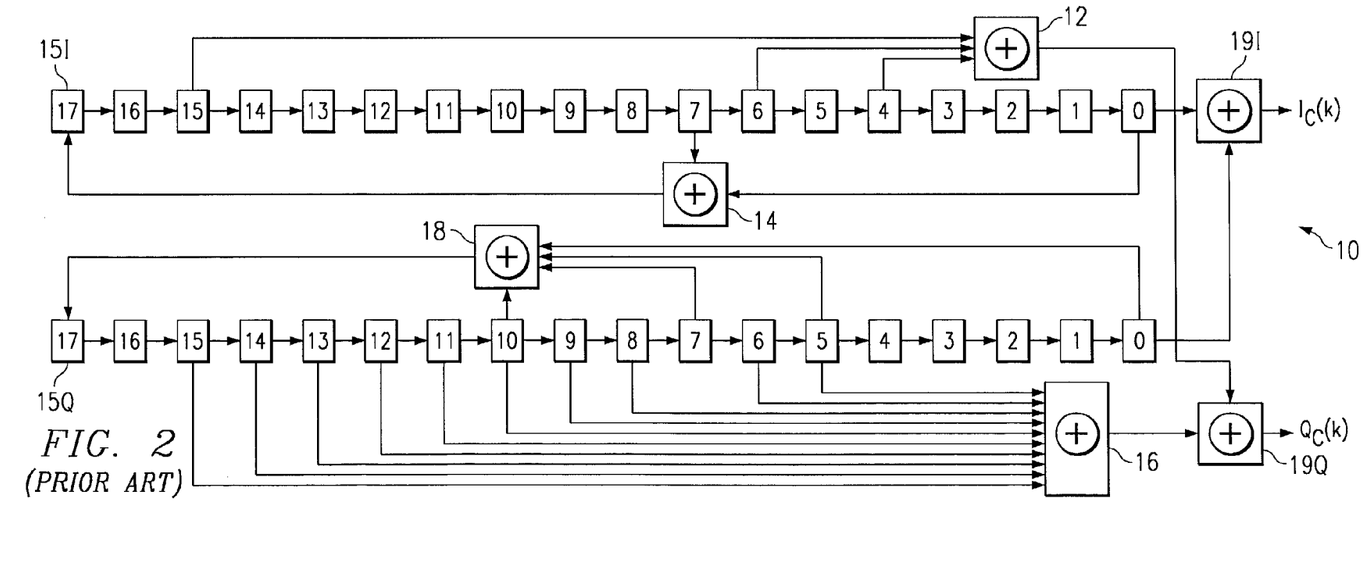
FIG. 2 is an electrical diagram, in block form, of a conventional code generator circuit.

By way of further background, FIG. 2 illustrates a conventional scrambling code generator 10. As mentioned above and as known in the art, the application of a scrambling code enables a wireless receiver to resolve those communications received from its own physical cell from those communications received from other cells, and unintended for receipt by that wireless element. As known in the art, scrambling code generator 10 generates in-phase and quadrature components $I_c(k)$, $Q_c(k)$, respectively, of a cell-specific scrambling code. These components are applied to respective in-phase and quadrature components of a datastream, modulated according to a quadrature amplitude modulation (QAM) constellation.

Scrambling code generator 10 of FIG. 2 includes delay stage sequence 15I and delay stage sequence 15Q, each sequence having eighteen delay stages numbered from 0 to 17 in this example. A sample of in-phase code component $I_c(k)$ is generated by exclusive-OR function 19I, which receives the outputs of the final delay stages, numbered 0, in delay stage sequences 15I, 15Q. A corresponding sample of quadrature code component $Q_c(k)$ is generated by exclusive-OR function 19Q, which receives the outputs of feed-forward exclusive-OR functions 12, 16, each of which receive the contents of delay stages 15I, 15Q in the corresponding sequences, selected according to the particular scrambling code polynomial. In this example, feed-forward exclusive-OR function 12 receives the outputs of the delay stages numbered 4, 6, and 15 in delay stage sequence 15I$_4$; feed-forward exclusive OR function 16 receives the outputs of the delay stages numbered 5 and 15 in delay stage sequence 15Q. The contents of delay stages 15I, 15Q are regenerated by feedback exclusive-OR functions 14, 18. In this example, feedback exclusive-OR function 14 receives inputs from the final delay stage (numbered 0) and the delay stage numbered 7 in delay stage sequence 15I, and forwards its output to the input of the first delay stage, numbered 17, in delay stage sequence 15I. Also in this example, feedback exclusive-OR function18 receives inputs from the final delay stage 15Q and from the delay stages numbered 5 and 7 in delay stage sequence 15Q, and has its output connected to the input of the first delay stage, numbered 17, in delay stage sequence 15Q.

Similarly as in the case of convolutional coder 5, scrambling code generator 10 may be realized by way of shift registers and combinatorial logic. However, in order to provide variations in the scrambling code to be applied, the exclusive-OR functions 12 through 18 must be selectable according to the code generating polynomial. Such flexibility requires a large number of potential connections both in and out of exclusive-OR functions, as well as circuitry for selectably enabling and disabling these potential connections.

By way of further background, conventional integer multiplier circuits, such as used in microprocessors and digital signal processors, are arranged to perform successive addition. For example, a typical conventional integer multiplier adds selected left-shifted replications of the multiplicand, with the summed shifted multiplicands being those corresponding to "1" bits in the multiplier; "0" bits of the multiplier block the addition of corresponding shift positions of the multiplicand from being included in the product. The additions include the use of carry-in and carry-out signals.

Figure 3:
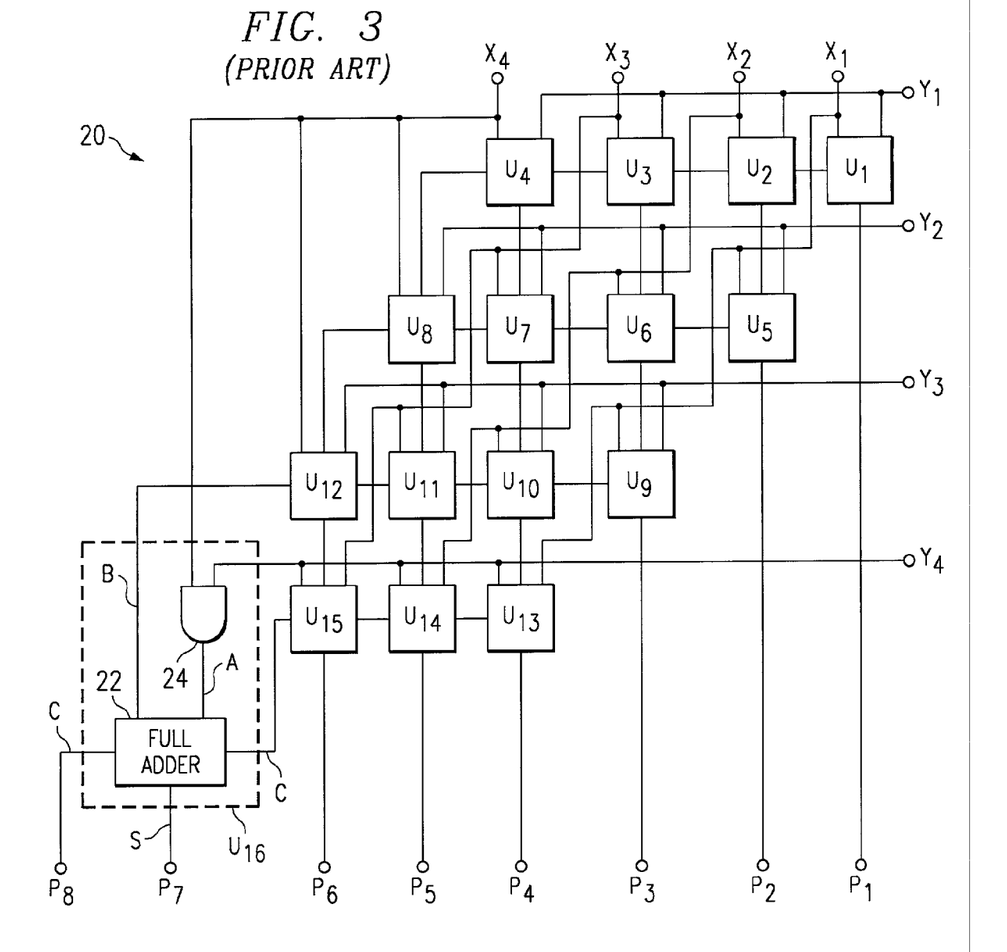
FIG. 3 is an electrical diagram, in block and schematic form, of a conventional parallel integer multiplier.

FIG. 3 illustrates conventional parallel multiplier 20, for multiplying two four-bit digital values X, Y. This construction is disclosed in U.S. Pat. No. 4,598,382. Multiplier 20 includes an array of sixteen full two-bit adder units $U_1$ through $U_{16}$. Adder units U are arranged in four rows of four, each row associated with one bit of multiplier Y. For example, adder units $U_1$ through $U_4$ are associated with multiplier bit $Y_1$, adder units $U_5$ through $U_8$ are associated with multiplier bit $Y_2$, and so on. Each row of adder units U receive the four bits $X_1$ through $X_4$ of the multiplicand, and the associated bit of multiplier Y for that row. In operation, multiplicand X is added to itself, left-shifted (i.e., multiplied by two), depending upon the state of the ascending bits of multiplier Y, with carries propagating accordingly. The resulting product word P is thus the binary integer product of multiplicand X and multiplier Y.

The construction of each adder unit U in multiplier 20 is illustrated with respect to adder unit $U_{16}$. As shown in FIG. 3, adder unit $U_{16}$ includes full two-bit adder 22, and AND gate 24. AND gate 24 receives a bit of multiplicand X (bit $X_4$ in this example, for adder unit $U_{16}$) and a bit of multiplier Y (bit $Y_4$ in this example, for adder unit $U_{16}$), and outputs addend A corresponding to the logical AND of these multiplier and multiplicand bits. In this way, the state of multiplier bit Y determines whether the corresponding multiplicand bit X is included in the sum performed by full adder 22. Addend B, presented to full adder 22, depends upon the particular position of adder unit U within multiplier 20. Adder units $U_1$ through $U_4$, in the top row of multiplier 20, simply receive a "0" bit for their addends B. Later rows of adder units U in multiplier 20 receive the results of earlier rows. For example, adder units $U_5$ through $U_7$, left-shifted by one position in the second row, receive sum bits S from a corresponding adder $U_2$ through $U_4$ in the first row; specifically, adder unit $U_5$ receives the sum output S of adder unit $U_2$, adder unit $U_6$ receives the sum output S of adder unit $U_3$, and adder unit $U_7$ receives the sum output S of adder unit $U_4$. The most significant adder unit U in each of the later rows receives, as its addend B, the carry output C of the most significant adder unit U in the previous row; for example, adder unit $U_8$ receives the carry out bit C from adder unit $U_4$. Each adder unit U other than the least significant position receives carry in bit C', corresponding to the carry out C bit of its least significant neighbor, and applies this carry in C' to its full adder 22.

The sum output bits of the least significant adder units $U_1$, $U_5$, $U_9$ in earlier rows are presented as product bits $P_1$, $P_2$, $P_3$, respectively. The sum output bits S from adder units U in the last row are presented as the higher order product bits. In the example of multiplier 20 in FIG. 3, the sum output bits S from adder units $U_{13}$ through $U_{16}$ correspond to product bits $P_4$ through $P_7$, respectively. The carry out bit C from the most significant adder unit U in the last row, adder unit $U_{16}$ in this example, becomes the most significant product bit, $P_8$ in this example.

BRIEF SUMMARY OF THE INVENTION

It is an object of the present invention to provide circuitry for efficiently encoding communicated datastreams.

It is a further object of the present invention to provide such circuitry that provide flexibility in the code generating polynomial coefficients.

It is a further object of this invention to provide such circuitry that can be readily implemented by the modification of known architectures.

It is a further object of this invention to provide such circuitry that is readily suited for implementation on a programmable device such as a digital signal processor.

It is a further object of this invention to provide such circuitry in the form of convolutional coding circuitry for encoding a datastream for wireless transmission.

It is a further object of this invention to provide such circuitry in the form of a code generator, such as for generating a scrambling code for wireless transmission.

Other objects and advantages of the present invention will be apparent to those of ordinary skill in the art having reference to the following specification together with its drawings.

The present invention may be implemented in a circuit for generating or applying a code, by way of a modified multiplier circuit. The multiplier circuit includes an array of gated exclusive-OR functions, for performing cumulative exclusive-OR operations upon shifted delayed bitstream data. The gating of the exclusive-OR operations are controlled responsive to coefficients of the code generator polynomials. The circuit is implemented by a parallel multiplier array of adders, with carry propagation blocked, and may be used for convolutional coding or scrambling code generation in a wireless communications unit.

DETAILED DESCRIPTION OF THE INVENTION

The present invention will be described in connection with a wireless voice and data communications system, such as a wireless telephone base station. It is contemplated, however, that the present invention may also be used with other communications systems, including other types of mobile wireless communications applications, other spread spectrum or broadband technologies, and other applications in the field of digital radio. It is to be understood, therefore, that the following description is presented by way of example only, and is not intended to limit the scope of the present invention as claimed.

Figure 4:
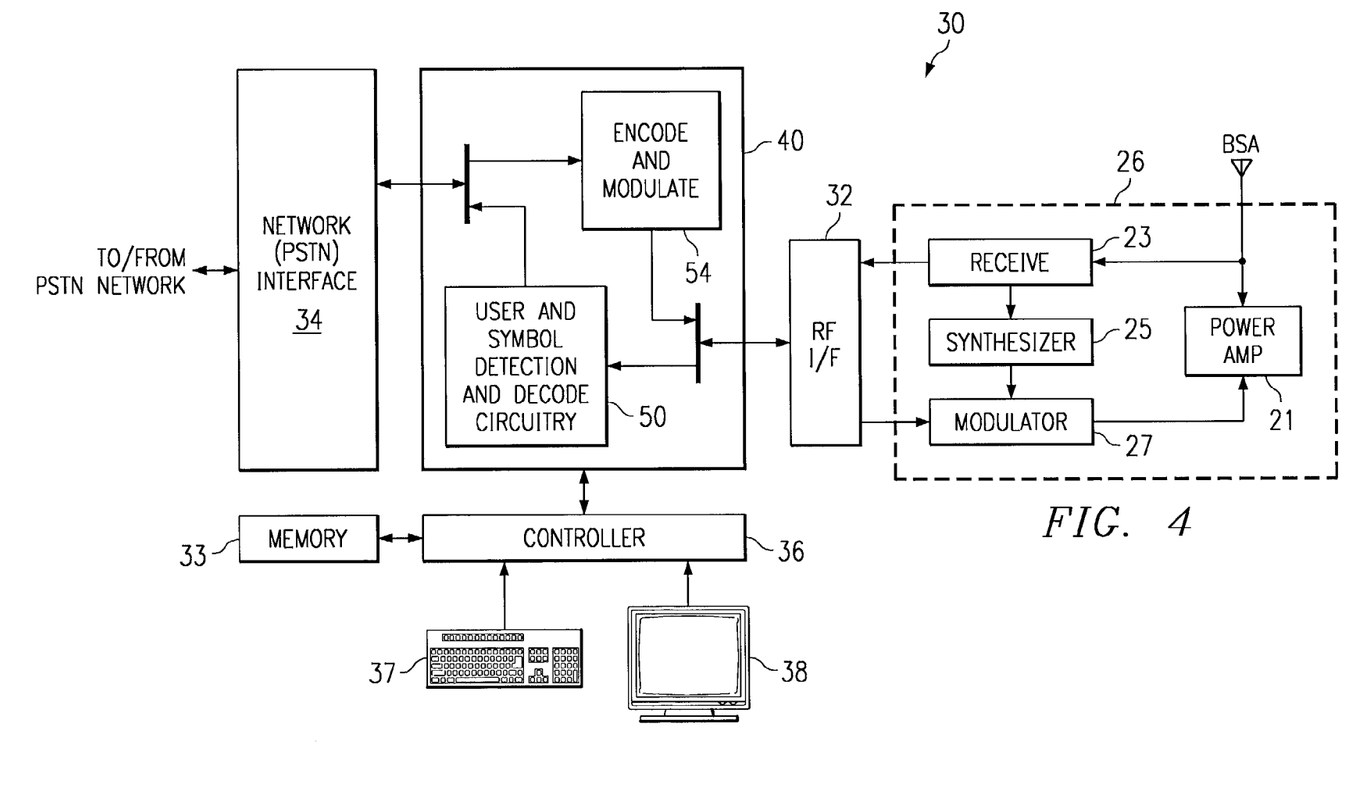
FIG. 4 is an electrical diagram, in block form, of a wireless base station in which the preferred embodiment of the invention is implemented.

Referring now to FIG. 4, wireless unit 30 constructed according to the preferred embodiment of the invention will now be described in detail. Wireless unit 30 of FIG. 4 corresponds to a wireless base station, for example according to at least the so-called "second generation", or "2G" capability, such as is typically used to carry out TDMA and CDMA broadband communication; it is further contemplated that wireless unit 30 may also be constructed to provide the so-called "third generation" or "3G" communications, which include data and video services. Of course, it is contemplated that the present invention may also be implemented in wireless handsets and other digital radio applications, for similar benefits from this invention. The architecture of the construction of wireless unit 32 shown in FIG. 4 is provided by way of example only, it being understood that such other alternative architectures may also be used in connection with the present invention.

Radio subsystem 26 of wireless base station 30 is directly connected to base station antenna BSA, and handles the power amplification and analog processing of signals transmitted and received over antenna A. On the transmit side, modulator 27 in radio subsystem 26 receives the signals to be transmitted from RF (radio frequency) interface circuitry 32, and generates a broadband modulated analog signal, under the control of synthesizer 25. Power amplifier 21 amplifies the output of modulator 27 for transmission via antenna BSA. On the receive side, incoming signals from antenna BSA are received by receiver 23, filtered and processed under the control of synthesizer 25, and forwarded to RF interface circuitry 32, which in turn forwards the signals to digital signal processor (DSP) 40.

DSP 40 preferably has a significant amount of processing capacity to handle the digital processing necessary for both the transmit and receive operations. An example of a suitable digital signal processor for use as DSP 40 is the TMS320c6x family of digital signal processors available from Texas Instruments Incorporated, a preferred example of which is the TMS320C6416 DSP.

RF interface circuitry 32 processes both incoming and outgoing signals within the analog baseband of wireless base station 30. On the transmit side, RF interface circuitry 32 receives digital signals from DSP 40, and performs the appropriate filtering and phase modulation appropriate for the particular transmission protocol. For example, multiple channels of encoded digital bitstreams, corresponding to the combination of both in-phase (I) and quadrature (Q) components, are forwarded to RF interface circuitry 32 by DSP 40. RF interface circuitry 32 converts these digital data into analog signals, phase-shifts the selected converted bitstreams to provide both in-phase (I) and quadrature (Q) analog signal components, and applies analog filtering as appropriate to the signals to be handed off to modulator 27 in radio subsystem 26.

On the receive side, RF interface circuitry 32 converts the analog signal received by receiver 23 of radio subsystem 26 into the appropriate digital format for processing by DSP 40. For example, in-phase (I) and quadrature (Q) components of the received signal are separated and filtered. Analog to digital conversion is then carried out by RF interface circuitry 32, so that digital bitstreams corresponding to the separated and filtered components of the received signal may be received by DSP 40.

DSP 40 executes the appropriate digital signal processing upon both the signals to be transmitted and those received. In this regard, DSP 40 is coupled to network interface 34, which in turn couples base station 30 to the computer and communications network, including the Public Switched Telephone Network (PSTN). Network interface 34 is a conventional subsystem, including such functions as a physical layer interface and a network interface adapter, and selected according to the type of network and corresponding interface desired for base station 30.

The digital functions performed by DSP 40 will depend, of course, upon the communications protocol used by wireless base station 30. The functions shown in FIG. 4 for DSP 40 correspond to those functions as performed for each user currently communicating with base station 30; the functionality for only one user is shown in FIG. 4, for clarity. On the receive side, DSP 40 will digitally perform such functions as a rake receive function, identifying the user associated with each communication, channel decoding of the data from RF interface circuitry 32 to retrieve a data signal from the received digitally spread signal, followed by the decoding of the speech symbols from the channel decoded data using techniques such as inverse discrete Fourier transforms (IDFT) and the like, as illustrated in FIG. 4 by user and symbol detection and decode circuitry 50. Equalization, error correction, and decryption processes are also performed upon the received signal as appropriate. The resulting signal processed by DSP 40 on the receive side is then forwarded to network interface 34, to be forwarded to the appropriate network destination.

On the transmit side, the incoming voice communications, or other incoming data in the 3G sense, from the PSTN network, are forwarded to DSP 40 by network interface 34. Encode and modulate function 54 performs the appropriate digital processing functions for the particular protocol. For example, encode and modulate function 54 may first encode the received digital data into symbols, for example by way of a DFT operation. These symbols are then spread, by way of a spreading code, into a sequence of chips according to a selected chip rate; the spreading may also include the spreading of the symbols into multiple subchannels. According to the preferred embodiment of the invention, which will be described in further detail below, a cell-specific scrambling code is then applied to the spread symbols, and the scrambled spread symbols are modulated. In general, this modulation splits the subchannels into in-phase (I) and quadrature (Q) groups, so that the eventual modulated signal includes both components. The spread spectrum sequence is converted into an analog signal by RF interface 32, with the desired filtering and pre-equalization to compensate for channel distortion, and is then transmitted over antenna BSA by radio subsystem 26.

Other support circuitry is also provided within wireless base station 30 as shown in FIG. 4. In this example, controller 36 handles the control of wireless base station 30 other than the data path. Such control functions include resource management, operating system control, and control of the human interface; in this regard, controller 36 operates with such functions as memory 33 (for storage of the operating system and user preferences), keyboard 37, and user display 38.

Figure 5:
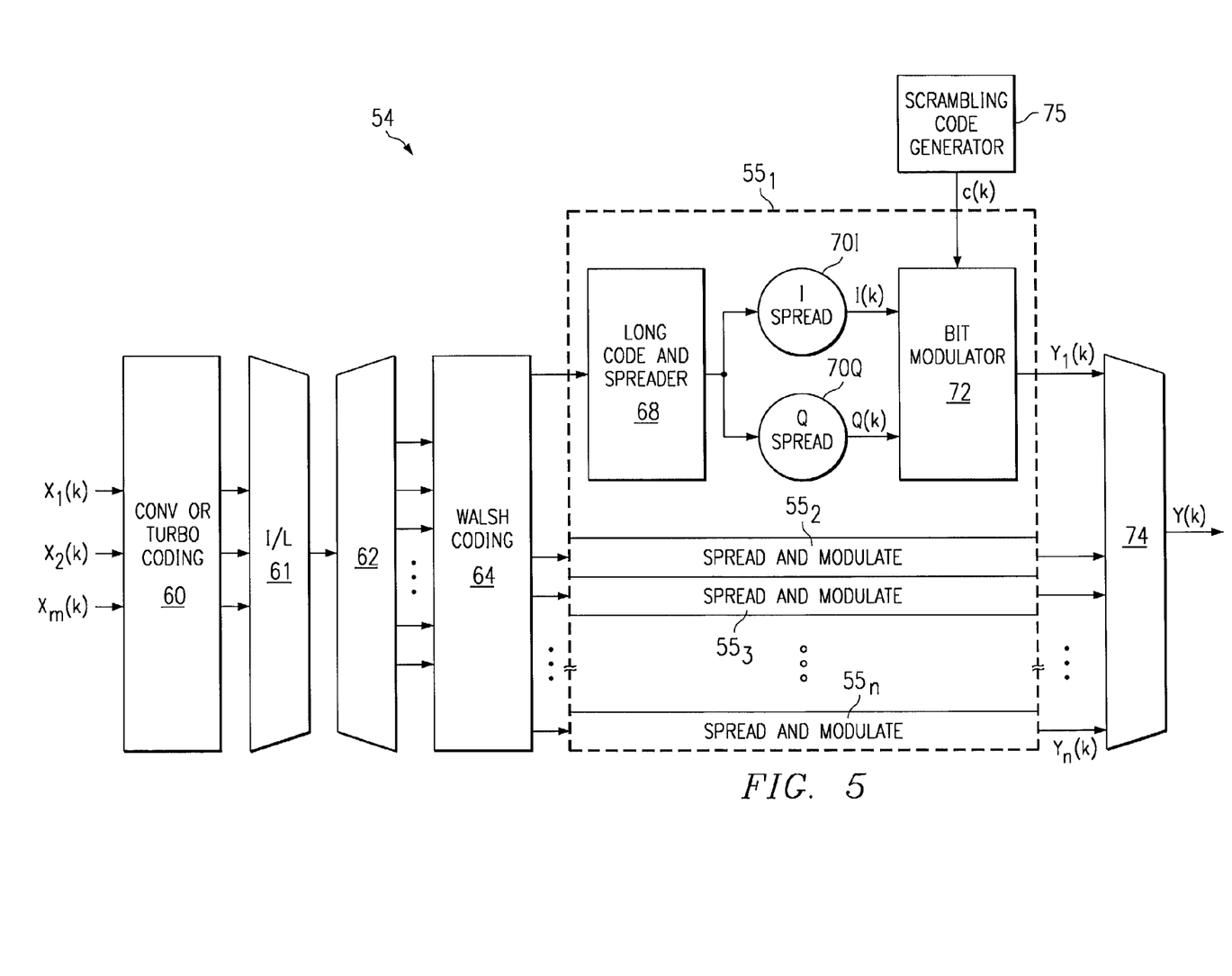
FIG. 5 is a functional diagram, in block form, of the operations involved in modulation of a data signal according to the preferred embodiment of the invention.

Referring now to FIG. 5, the functional construction and operation of encode and modulate function 54 will now be described. In the example of FIG. 4, in which encode and modulate function 54 is illustrated as contained within DSP 40, it is contemplated that many of these operations within encode and modulate function 54 can be carried out by the execution of software routines by DSP 40. It is also contemplated that some or all of these functions illustrated in FIG. 5 can be performed by dedicated hardware, such as custom or semi-custom logic circuits. The tradeoff between hardware and software realizations of these functions is contemplated to be within the skill and discretion of the artisan having reference to this specification.

Multiple datastreams X(k) are received by encode and modulate function 54, each datastream X(k) corresponding to one of multiple subchannels, each of which will be separately spread and encoded as typical for broadband communications. Each data stream X(k) is applied to convolution coding function 60 to insert redundancy into that subchannel for purposes of forward error correction. The construction of convolutional coding function 60 according to the preferred embodiment of the invention will be described in detail below. These streams are then multiplexed by interleaver 61, and then demultiplexed by demultiplexer 62 prior to application to Walsh coding function 64. As known in the art, Walsh coding function 64, as known in the art, multiplies the data stream by a spreading code (e.g., a Walsh code, or Walsh-Hadamard code) to spread each bit of bitstream X(k) into a modulated sequence of multiple "chips". In effect, Walsh coding function 64 converts each bit of its received data stream into a series of samples, or chips, modulated by the spreading code, so that the chip rate out of function 64 is a modulated multiple of the data rate of the input datastream, for each subchannel.

As shown in FIG. 5, the subchannel outputs of Walsh coding function 64 are then applied to separate spread and modulate functions $55_1$ through $55_n$. In each of spread and modulate functions $55_1$ through $55_n$, a so-called "long" modulation code is then applied to the datastream by long code spreader 68. As known in the art, the "long" code is a modulation code that is selected in a pseudo-random manner, to greatly reduce the probability of a collision among multiple wireless units in a given coverage area. The spreading long code applied in function 68 is a "long" code, to ensure that multiple orthogonal communications can be carried out simultaneously within the cell.

The output of long code spreader function 68 is a sequence of digital words. This output sequence is applied to in-phase spread function 70I and to quadrature spread function 70Q, assigning some of the multiplexed data words to an in-phase (I) channel and some to a quadrature (Q) channel, as precursors to I and Q components, respectively, of a complex analog output signal. Often, specific subchannels are assigned to the I and Q components; for example, in a simple system, a data channel may be assigned to the in-phase component, while a control channel may be assigned to the quadrature component. More typically, multiple data subchannels are assigned to each of the I and Q channels. At this point in the encoding and modulation process, the I and Q channels are still sequences of digital words.

Data sequences I(k), Q(k), from the outputs of spread functions 70I, 70Q, respectively, are then applied to bit modulator 72. Bit modulator function 72 is either a software routine executable by DSP 40, or alternatively is dedicated logic circuitry, that combines these data sequences I(k), Q(k) with a cell-specific scrambling code c(k) that is generated by scrambling code generator 75 to produce a modulated output sequence Y(k). The construction of scrambling code generator 75 according to the preferred embodiment of the invention will be described in further detail below. The scrambled output sequence Y(k) can be resolved by the receiving element to distinguish these communications from those that may have been received from wireless units in other physical cells. Alternatively, the preferred embodiment of the invention may be used in connection with the modulation of complex digital words with other types of scrambling codes, and with other complex codes in general.

The output of the spread and modulate functions 55 are then recombined by multiplexer 74 into an output datastream Y(k), and forwarded to RF interface 32 (FIG. 4) for transmission.

As discussed above in the Background of the Invention, conventional convolutional coding circuits and code generator circuits typically involve delay stages or shift registers, in combination with exclusive-OR functions, but with a significant amount of complexity required for programmability. In connection with this invention, it has been discovered that one may compare the truth table of the exclusive-OR function with that of a full adder with carries. The full adder truth table, for one-bit addends A, B, is:

| Carry-in | Addend A | Addend B | Carry-out | Sum |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

The well-known exclusive-OR truth table, applied to one-bit inputs A, B, is:

| Input A | Input B | A ⊕ B |
|---|---|---|
| 0 | 0 | 0 |
| 0 | 1 | 1 |
| 1 | 0 | 1 |
| 1 | 1 | 0 |

This exclusive-OR truth table corresponds exactly to the full adder truth table, if carries (both in and out) are blocked or ignored. As will become apparent from the following description of the preferred embodiment of the invention, this exact correspondence is used to advantage in an architecture for convolutional and other digital coding.

Figure 6A:
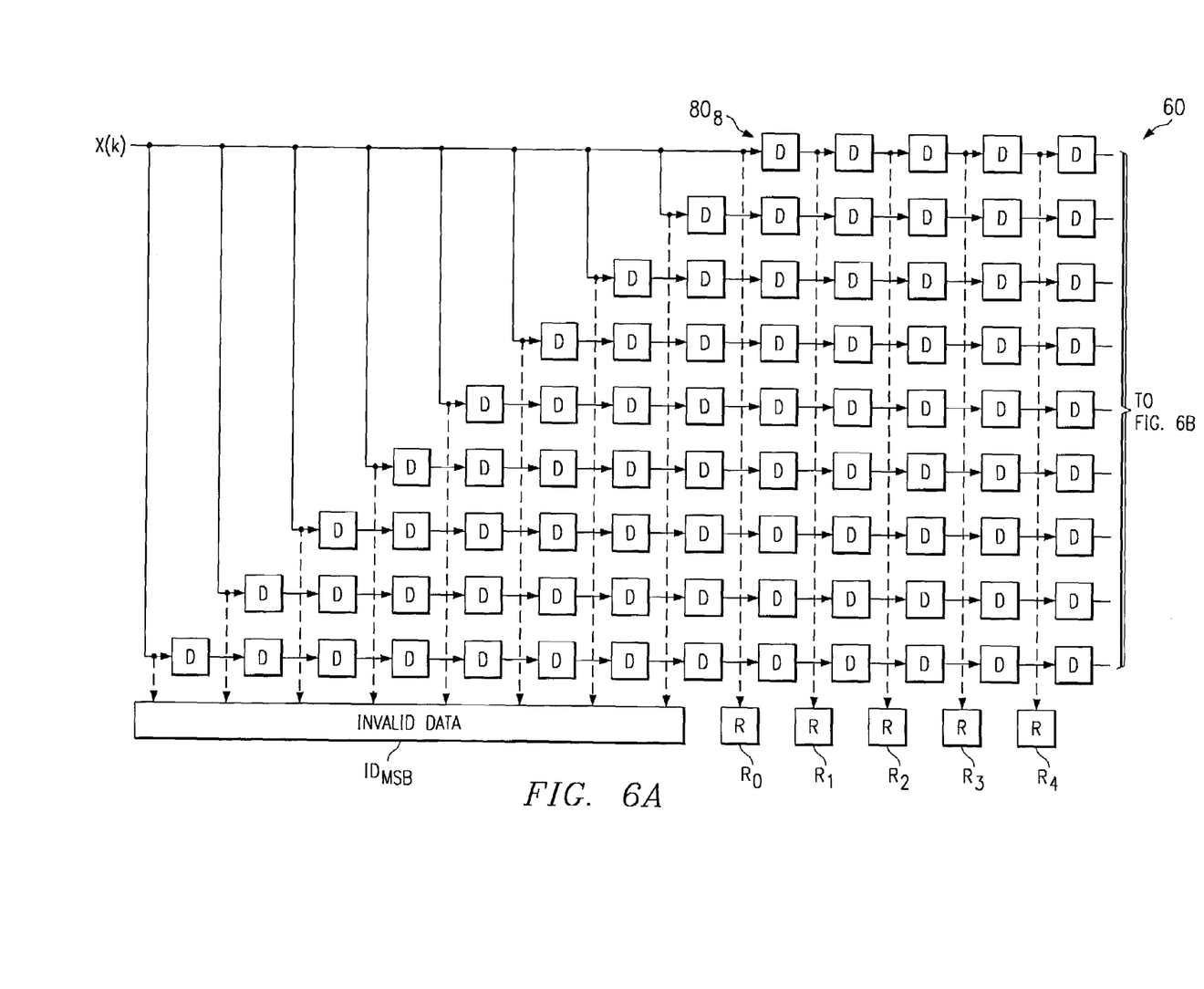
FIGS. 6a and 6b are a data flow diagram, in block form, illustrating the operation of a convolutional coding function according to the preferred embodiment of the invention.
Figure 6B:
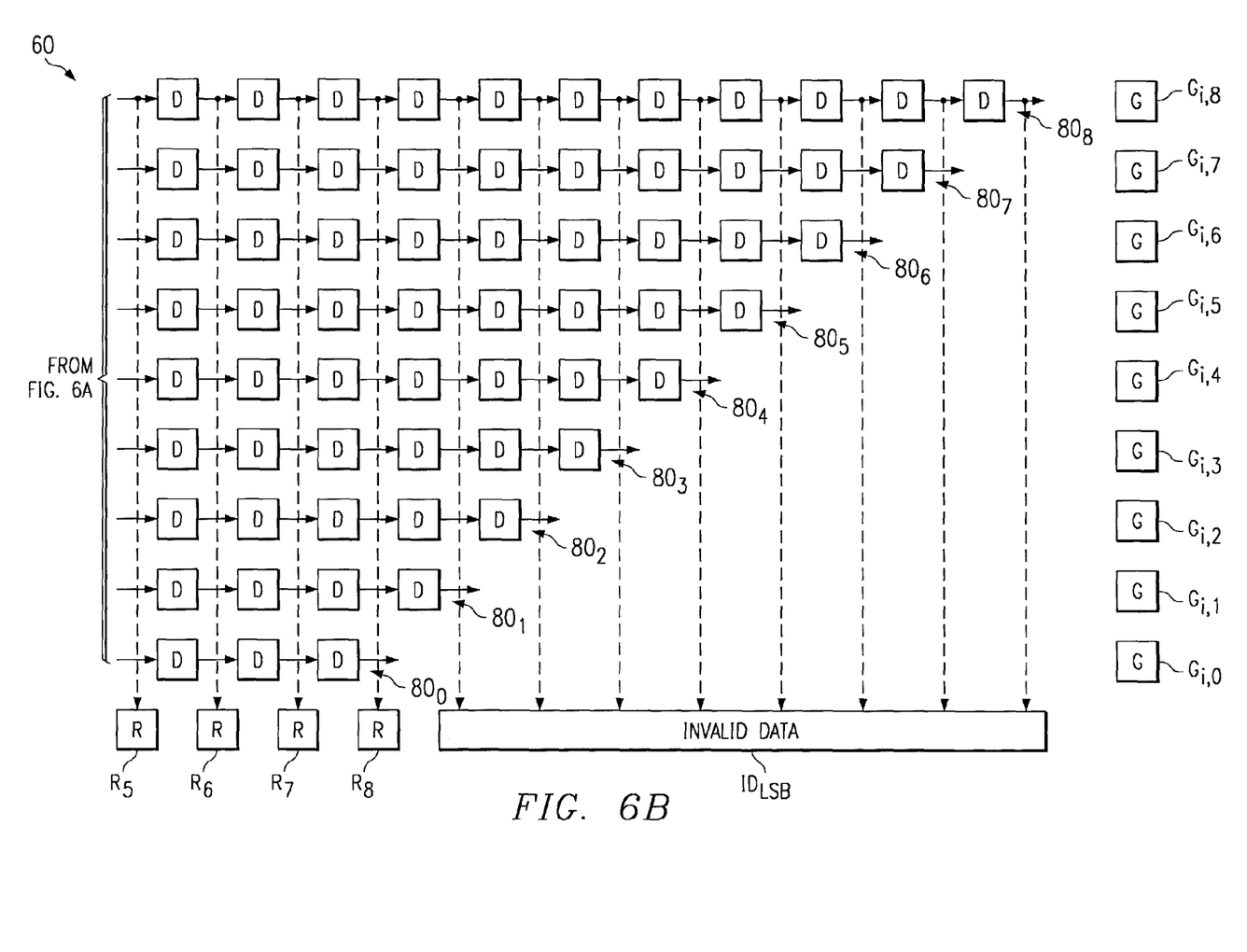

Referring now to FIGS. 6a and 6b, the data flow in convolutional coding function 60 according to the preferred embodiment of the invention will now be described, for one subchannel; the architecture and construction of convolutional coding function 60 according to the preferred embodiment of the invention will be described in detail below relative to FIGS. 8 and 9. As noted above, encode and modulate function 54 can operate on multiple subchannels in parallel, and as such convolutional coding function 60 is typically embodied in multiple instances, one instance for each of the subchannels being encoded. In the example of FIGS. 6a and 6b, the code generator polynomial $G_i$ is ninth-order, such that nine (one-bit) coefficients $G_{i,0}$ through $G_{i,8}$ are used, coefficient $G_{i,8}$ being the most significant coefficient. Also in this example, nine coded bits $R_0$ through $R_8$ are generated at a time. In convolutional coding function 60, one row 80 of delay stages D is provided for each bit of the code generator polynomial. Accordingly, in the example of FIGS. 6a and 6b, convolutional coding function 60 includes nine delay stage rows $80_0$ through $80_8$. Each row 80 includes seventeen delay stages D in this example, which corresponds to the convolution length (nine) plus the number of output bits (eight) presented.

Of course, the particular construction of convolutional coding function 60 can vary widely. For example, it is contemplated that a 32×16 arrangement, generating sixteen code bits at a time, will be attractive in many applications. The particular size and organization will thus depend upon the particular design and application.

In the data flow through convolutional coding function 60 according to this embodiment of the invention, each delay stage D has an output that is forwarded to the input of the next delay stage in its same row 80, and that is also forwarded to be combined to the next row, in the least significant direction of code generator polynomial $G_i$, by an exclusive-OR function. In FIGS. 6a and 6b, the solid horizontal lines thus represent the temporal shifting of the state of each of delay stages D along common rows 80, while the dashed vertical lines represent exclusive-OR combinations toward result bits R. According to this embodiment of the invention, the outputs of delay stages D in a common column (i.e., those delay stages D aligned with one another in each of rows 80) are exclusive-ORed depending upon the state of the corresponding coefficient bit G. This exclusive-OR gating is implemented by blocking the forwarding of carry bits within a parallel multiplier as will now be described relative to FIG. 7.

Figure 7:
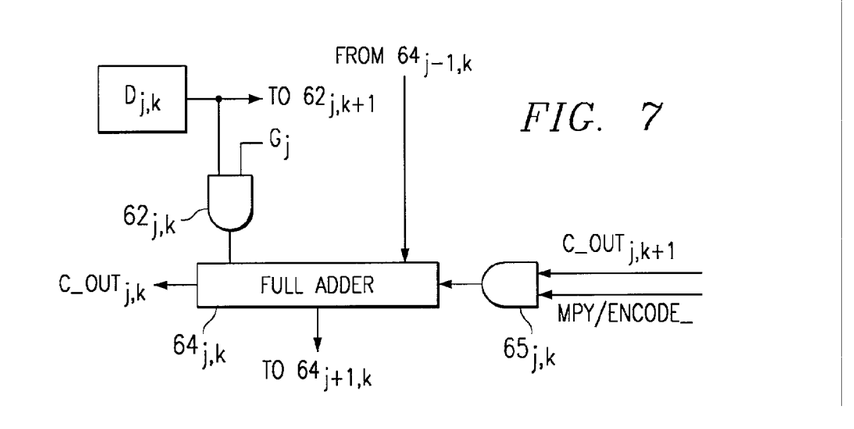
FIG. 7 is an electrical diagram, in block form, illustrating one stage of the convolutional coding function according to the preferred embodiment of the invention.

FIG. 7 illustrates delay stage $D_{j,k}$, which is the kth delay stage in the jth row $80_j$. The output of delay stage $D_{j,k}$ is applied to one input of AND gate $62_{j,k}$ and is also forwarded to the input of the next delay stage $D_{j,k+1}$ in row $80_j$. The other input to AND gate $62_{j,k}$ is the code generator coefficient $G_j$ for row $80_j$. The output of AND gate $62_{j,k}$ is applied to one input of full adder $64_{j,k}$, which receives the output of a corresponding full adder $64_{j-1,k}$ in the previous row at its other input. In this way, if the code generator bit $G_j$ is a "1", the state of delay stage $D_{j,k}$ is applied to full adder $64_{j,k}$ along with the output of the previous full adder $64_{j-1,k}$ is to derive the state to be applied to full adder $64_{j+1,k}$ in the next row $80_{j+1}$. If the code generator bit $G_j$ is "0", the output of the previous full adder $64_{j-1,k}$ is simply passed along to full adder $64_{j+1,k}$ in the next row $80_{j+1}$ without change.

AND gate $65_{j,k}$ receives carry-out bit $C\_OUT_{j,k+1}$ from previous full adder $64_{j,k+1}$ at one input, and control signal MPY/ENCODE_ at another input. In an encode mode, control signal MPY/ENCODE_ is at a low logic level, which blocks carry-out bit $C\_OUT_{j,k+1}$ from being applied to full adder $64_{j,k}$ and thus from being incorporated into the addition. A corresponding AND gate 65 is included at each exclusive-OR location in convolutional coding function 60, and therefore carry-out bit $C\_OUT_{j,k}$ from full adder $64_{j,k}$ is blocked from being applied to the next full adder $64_{j,k+1}$. This blocking of carry bits by AND gate 65 causes full adder $64_{j,k}$ to have the identical truth table as an exclusive-OR gate, as discussed above. In a multiply mode, however, with control signal MPY/ENCODE_ at a high level, carry bits are applied to each full adder 64, permitting the same circuitry to be used as a multiplier when desired.

Referring back to FIGS. 6a and 6b, convolutional coding function 60 is thus operable to generate code output bits based upon the exclusive-OR of a current input bit x(k) and selected ones of its eight previous values. The current input bit x(k) is applied to the input of the first delay stage D in each of rows 80. Rows 80 of delay stages D effectively operate as shift registers, such that the receipt of each successive input bit x(k) with each clock cycle will advance the contents of delay stages D along rows 80. As a result, result bits $R_0$ through $R_8$ correspond to nine combinations of input bit x(k) sequences. For example, result bit $R_0$ is generated from the exclusive-OR combination of one or more of input bits x(k), x(k−1), x(k−2), . . . x(k−8). Similarly, result bit $R_1$ is generated from the exclusive-OR combination of one or more of input bits x(k−1) through x(k−9), and so on, with last result bit $R_8$ generated from the exclusive-OR combination of one or more of input bits x(k−8) through x(k−16). The selection of those input bits x to be combined in exclusive-OR fashion depend upon the states of the code generator coefficients $G_{i,k}$ in FIGS. 6a and 6b; the same coefficient bit $G_{i,k}$ is applied along the entire row $80_j$.

The length of rows 80 are equal, for purposes of data consistency. As a result, as shown in FIGS. 6a and 6b, invalid result bits $ID_{MSB}$ and $ID_{LSB}$ are generated but ignored; these result bits being invalid because they do not include a possible bit from each row 80.

In operation, convolutional coding function 60 receives a sequence of input data bits x(k) of a length corresponding to the length of the convolution to be performed. In the example of FIGS. 6a and 6b, in which the convolution length is nine, nine input data bits x(k) through x(k−8) are applied in sequence to convolutional coding function 60. The previous contents x(k−9) through x(k−16) of delay stages D in rows 80 are shifted accordingly, with older data bits x(k−17) et seq. shifted out of convolutional coding function 60. Each row 80 of convolutional coding function 60 thus contains data bits x(k) through x(k−16), with input data bit x(k) at the input to its first delay stages, and input data bits x(k−1) through x(k−16) at the outputs of its sixteen delay stages D.

The coefficients $G_{1,0}$ through $G_{1,8}$ of a first convolutional code are then applied to convolutional coding function 60, in this example. As described above, the most significant bit $G_{1,8}$ is applied to the right-most shifted (top) row 80$_8$, and the least significant bit $G_{1,0}$ is applied to the left-most shifted (bottom) row 80$_0$. The state of the coefficients $G_{1,j}$ determine the exclusive-OR operations to be performed by each column of convolutional coding function 60, in the manner described above relative to FIG. 7. The exclusive-OR operation generates nine useful result bits $R_0$ through $R_8$, which are then forwarded along in encode and modulate function 54, for example to interleaver 61 (FIG. 5).

A next set of coefficients $G_{2,0}$ through $G_{2,8}$ are then applied to convolutional coding function 60, for the set of input data bits x(k) through x(k−16) retained by rows 80. These coefficients $G_{2,j}$ again control the exclusive-ORing of input data bits x(k) through x(k−16), producing another set of result bits $R_0$ through $R_8$ for this convolutional code. The code rate of convolutional coding function 60 determines the number of sets of coefficients $G_{i,j}$ that are applied. For example, a code rate of 1/3 will be effected by applying three sets of coefficients $G_{i,j}$ to rows 80 of convolutional coding function 60. After the last set of coefficients $G_{i,j}$ are applied and the result bits R generated, the next sequence of input bits x can then be shifted into convolutional coding function 60 and the process repeated.

According to the preferred embodiment of the invention, convolutional coding function 60 is implemented by way of a modified multiplier circuit. FIG. 8 illustrates an example of convolutional coding function 60, including modified multiplier circuit 90 constructed according to this embodiment of the invention.

The inputs to modified multiplier circuit 90 include input data bits x(k), which is applied to the first of a sequence of delay stages $D_0$ through $D_{m-1}$. Delay stages $D_0$ through $D_{m-1}$ may be realized by way of a shift register, if desired. Input data bit x(k) is also applied to an input of modified multiplier circuit 90, along with the outputs of each of delay stages $D_0$ through $D_{m-1}$, representing data bits x(k−1) through x(k−m). Input data bits x(k) through x(k−m) thus take the place of the multiplicand to be applied to modified multiplier circuit 90.

The other input to modified multiplier circuit 90 is a selected one of a set of coefficients $G_i$, corresponding to the code generator polynomial. In this example, in which the code rate is 1/3, three registers 94$_0$, 94$_1$, 94$_2$, are provided for storing coefficients $G_1$, $G_2$, $G_3$, respectively. The outputs of registers 94 are applied to multiplexer 92, which selects one set of coefficients $G_i$ to be applied to modified multiplier circuit 90 as the multiplier. It is contemplated that the contents of register 94, and thus the code generator coefficients $G_i$, can be readily rewritten by digital circuitry as desired, via the operation of programmable logic such as a digital signal processor or microprocessor. Great flexibility in the operation of convolutional coding circuit 60 according to this embodiment of the invention is therefore attained.

Figure 8:
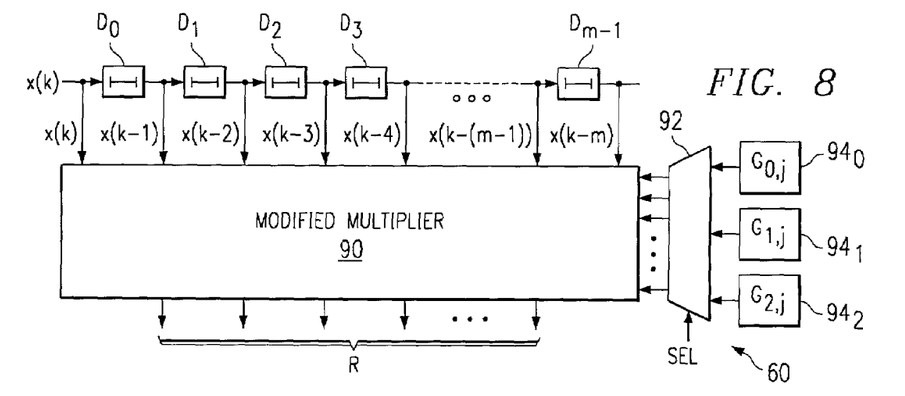
FIG. 8 is an electrical diagram, in block form, illustrating the construction of a convolutional coding function according to the preferred embodiment of the invention.

In addition, as shown in FIG. 8, modified multiplier circuit 9b according to this embodiment of the invention also includes receives a control input on line MPY/ENCODE_. The control input on line MPY/ENCODE permits selective control of the operation of modified multiplier circuit 90 so that it operates as a conventional multiplier in a multiply mode, but as an exclusive-OR function as described above relative to FIGS. 6 and 7 in an encoding mode. This dual function of modified multiplier circuit 90 enables its efficient use in conventional integrated circuits, such as a microprocessor or digital signal processor.

The output of modified multiplier circuit 90 are result bits R. As described above relative to FIGS. 6a and 6b, the number of result bits R matches the convolution length of the code generator polynomials, and thus the number of coefficients in each set of coefficients $G_{i,j}$. As described above relative to FIGS. 6a and 6b, other data bits are also generated by modified multiplier circuit 90, but are invalid and thus ignored.

The example of convolutional coding circuit 60 illustrated in FIG. 8 operates upon single-bit input data bits x and single-bit coefficients $G_{i,j}$. It is contemplated, in connection with this invention, that the present invention may alternatively be applied to multiple bit data input samples, and multiple bit coefficient values, by straightforward extension of the architecture of modified multiplier 90 and the rest of convolutional coder circuit 60.

Figure 9:
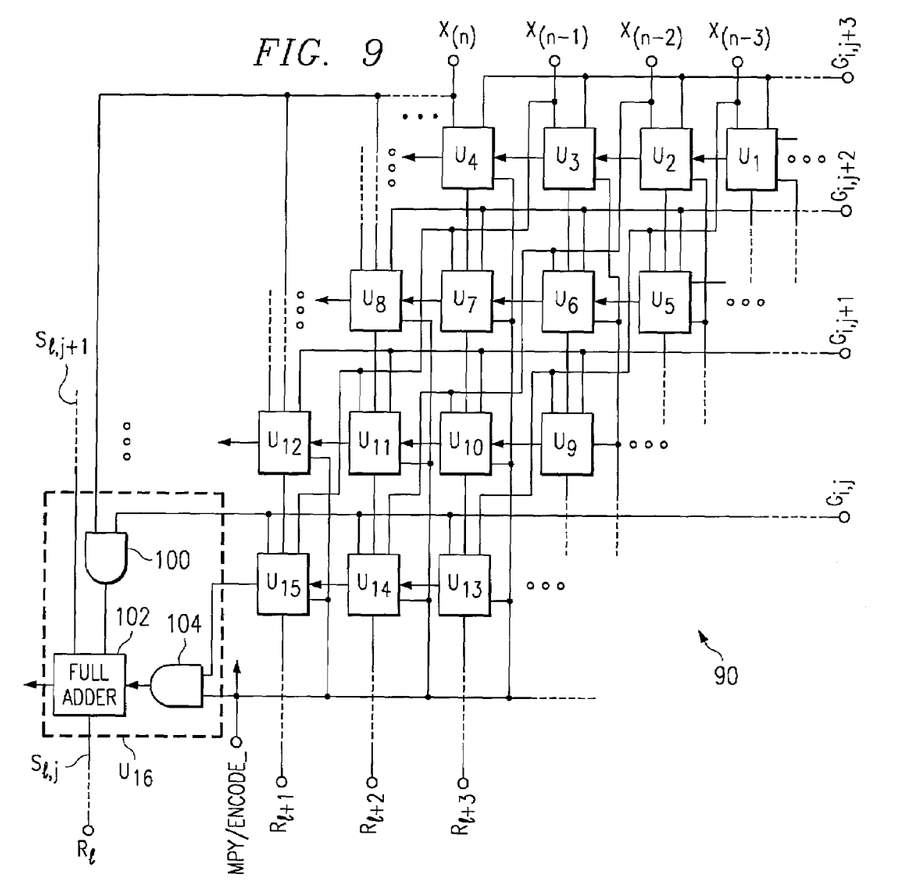
FIG. 9 is an electrical diagram, in block form, illustrating the construction of the modified multiplier circuit according to the preferred embodiment of the invention.

Referring now to FIG. 9, the construction of modified multiplier 90 will now be described in further detail, with reference to a detailed description of a representative portion. As described above, the logical truth table of an exclusive-OR function is equal to the logical truth table of an adder, if carry-in and carry-out bits are ignored or blocked.

In the portion of modified multiplier 90 illustrated in FIG. 9, an array of sixteen adder units U are illustrated, for performing the exclusive-OR functions involving input data bits x(n) through x(n−3), which are a subset of input data bits x(k) through x(k−m) applied to modified multiplier 90. The exclusive-OR functions are controlled by code generator polynomial coefficients $G_{i,j}$ through $G_{i,j+3}$, which are a subset of coefficients $G_i$, through $G_i$ applied by multiplexer 92 to modified multiplier 90. Of course, the number of adder units U within modified multiplier circuit 90 will be the product of the number of coefficient bits $G_i$ times the number m+1 of input data bits x(k) through x(k−m) applied to modified multiplier circuit 90.

As shown in FIG. 9, with reference to adder unit $U_{16}$, each adder unit U includes adder 102 and AND gate 100. Adder 102 is constructed in the conventional manner as a full adder, except that it receives no carry-in bit and produces no carry-out bit. AND gate 100 in each adder unit U receives the corresponding code generator polynomial coefficient $G_{i,j}$ at one input, and the corresponding input data bit x at its other input; the output of AND gate 100 is forwarded as one addend (A) to adder 102. The other addend (B) applied to adder 102 is the sum bit S from the adder unit U in the adjacent higher order row. Each adder unit U then produces a sum bit S responsive to the binary sum, without carry, of the bits at its addend A and B inputs. For example, with reference to adder unit $U_{16}$ of FIG. 9, which is in the $1^{th}$ column and $j^{th}$ row, sum bit $S_{i,j+1}$ is received at one addend input (B) of full adder 102, and its other addend input (A) receives the logical AND (performed by AND gate 100) of input data bit x(n) and coefficient bit $G_{i,j}$. The output of adder unit $U_{16}$ is sum bit $S_{i,j}$, which is forwarded to the aligned adder unit in the next least significant row.

According to this embodiment of the invention, each adder unit U also includes AND gate 104, which receives the carry-out bit from a preceding adder unit in the same row at one input, and which receives a control signal MPY/ENCODE_ at another input. In the example of FIG. 9, AND gate 104 in adder unit $U_{16}$ receives the carry-out bit from adder unit $U_{15}$ at that input. Control signal MPY/ENCODE_ is applied to each adder unit U in modified multiplier 90, as shown in FIG. 9, to permit modified multiplier 90 to selectably operate either as a conventional parallel multiplier in a multiply mode (line MPY/ENCODE_ at a high level), or as an exclusive-OR "engine" as used in the coding functions such as convolutional coding function 60 in an encoding mode (line MPY/ENCODE_ at a low level). As described above relative to FIG. 7, carry bits are blocked by line MPY/ENCODE_ at a low level, which forces the output of each AND gate 104 low, regardless of the state of its corresponding carry-out bit. In this state, full adder 102 performs the exclusive-OR of their respective addends, because the truth table of an adder equates to that of an exclusive-OR gate when carries are ignored.

Modified multiplier circuit 90 according to this embodiment of the invention can also operate as a conventional multiplier in multiply mode (fine MPY/ENCODE_ at a high level), because in this state each AND gate 104 in each adder unit U will pass the carry-out bit from the previous adder unit U in the same row to its full adder 102. This dual function capability enables modified multiplier circuit 90 to function as a conventional multiplier, for example as often included within programmable logic circuits such as microprocessors and digital signal processors.

Alternatively, the present invention can be implemented without modified multiplier circuit 90 having this dual function. In this alternative implementation, AND gates 104 can be eliminated so long as none of adder units U have either a carry-out output or a carry-in input. The coding function described in this specification will be performed identically by such an alternative implementation, but of course the multiplier will not be capable of performing a conventional parallel multiplication and therefore will not be available outside of the coding functions described in this specification.

As shown in FIG. 9, those adder units U at the edges of modified multiplier circuit 90, and that have no aligned adder unit U in a more significant bit position and therefore receive no previous sum bit, simply receive a "0" at their addend (B) input; alternatively, full adder 102 need not be provided in those adder units U. Those adder units U in the least significant (bottom) row of modified multiplier circuit 90 produce a result bit R at their sum output. According to the data flow arrangement of FIGS. 6a and 6b, some of these sum results will be ignored, because the exclusive-ORs along those columns are invalid.

According to the preferred embodiment of the invention, therefore, an efficient architecture for convolutional coding is provided. The architecture is implemented by way of a simple modification of the known parallel multiplier, with the modification merely involving eliminating carry-in and carry-out bits in the parallel adders in the multiplier. The convolutional code can be readily modified, for example by writing new coefficients $G_i$ into registers 94. Additionally, the code rate can be modified by varying the number of coefficient sets applied to modified multiplier 90. These and other advantages will be apparent to those skilled in the art having reference to this specification.

Figure 10:
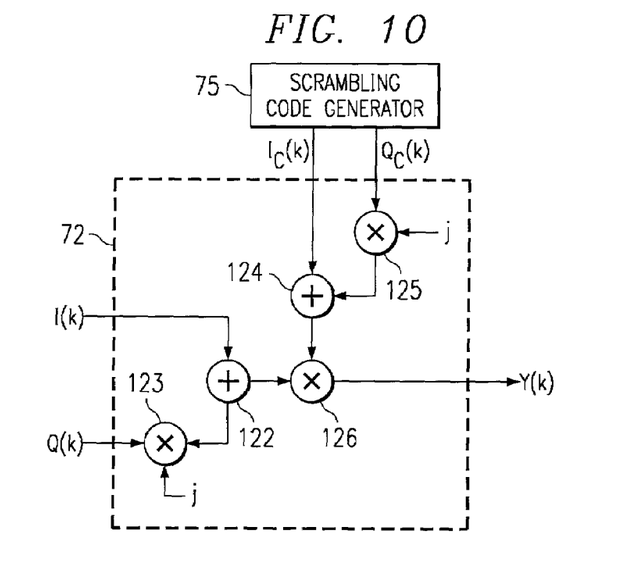
FIG. 10 is an electrical diagram, in block form, illustrating the scrambling code generation and bit modulation functions of the wireless base station of FIG. 4.

Referring now to FIG. 10, another application of the modified multiplier circuit according to the present invention, directed to the generation of a scrambling code for wireless communications, will now be described. Referring back to FIG. 5, encode and modulate function 54 includes scrambling code generator 75, which generates in-phase and quadrature components $I_c(k)$, $Q_c(k)$, respectively, of the scrambling code that is applied to the modulated datastream. As shown in FIG. 10, scrambling code generator 75 generates scrambling code components $I_c(k)$, $Q_c(k)$ which are applied to in-phase and quadrature data components I(k), Q(k), respectively, by bit modulator function 72.

FIG. 10 illustrates the data flow of bit modulator function 72, according to a conventional modulation approach. The operations shown in FIG. 10 for bit modulator function 72 are conventionally carried out by digital signal processing operations, such as may be carried out by a high performance digital signal processor (DSP), such as the TMS 320c5x or 320c6x families of digital signal processors available from Texas Instruments Incorporated.

In the operation of bit modulator function 72, the spread data stream is represented in FIG. 10 as having an-phase component I(k) and a quadrature component Q(k). Multiplier 123 effectively shifts each digital word in the sequence of quadrature component Q(k) by 90° (indicated by multiplication by square root of −1, represented in the art as imaginary operator "j"). Adder 122 then combines this phase-shifted quadrature component jQ(k) with its corresponding digital word in the sequence of in-phase component I(k). The combined I and Q components from adder 1222 are then scrambled by a scrambling code c(k) prior to its transmission.

As described above, and as conventional in the cellular telephone art, the scrambling code generated by scrambling code generator 75 is cell-specific in the downlink case, in that all transmissions from a central office that take place in the same physical cell use the same scrambling code. The scrambling code thus allows each remote system element to resolve incoming communications for its cell from those that may be received from other cells. Conversely, in the uplink case, the scrambling code is user-specific, dedicated to the particular transmitting wireless unit. Typically, the scrambling code is a "long" code, for example 4096 chips in length. According to this embodiment of the invention, scrambling code generator produces both an in-phase component $I_c(k)$ and a quadrature component $Q_c(k)$ The construction of scrambling code generator 75 according to this embodiment of the invention will be described in further detail below.

Similarly as for the data bitstream, in-phase scrambling code component $I_c(k)$ is added, by adder 124, with quadrature scrambling code component $Q_c(k)$ after application of a 90° phase-shift by multiplier 125. The combined in-phase and quadrature data signal from adder 2 is mixed with the combined in-phase and quadrature scrambling code signal from adder 124, at mixer 126. In the digital context, mixer 126 is a complex multiplier function or circuit. Signal Y(k), at the output of mixer 126, is the complex modulated output of these operations, and includes in-phase and quadrature components. These components are then filtered and used to modulate in-phase (cosine wave) and quadrature (sine wave) analog signals at the appropriate carrier frequency.

Other bit modulation techniques may alternatively be used, in place of bit modulator function 74. An example of such another bit modulation technique is described in copending application Ser. No. 10/135,658, filed Apr. 29, 2002, entitled "Multiple Bit Complex Bit Modulation", commonly assigned with this application to Texas Instruments Incorporated and incorporated herein by this reference. According to this alternative technique, the bit modulator architecture corresponds to a split adder that performs a Gray Code addition of corresponding bits of the in-phase and quadrature data components with corresponding bits of the in-phase and quadrature scrambling code components. The result is a combined in-phase bit and a combined quadrature bit for each bit position in the datastream. The split adder operation inserts a −45° phase shift into the sum, as compared to the conventional mixer, and a reduction in amplitude by a factor of $1/\sqrt{2}$. However, the phase shift is not relevant to the transmission, and the attenuation can be readily compensated, if desired. In this alternative bit modulation approach, the Gray Code addition takes the place of a complex multiplication, thus saving significant processing capacity and reducing circuit complexity.

Figure 11:
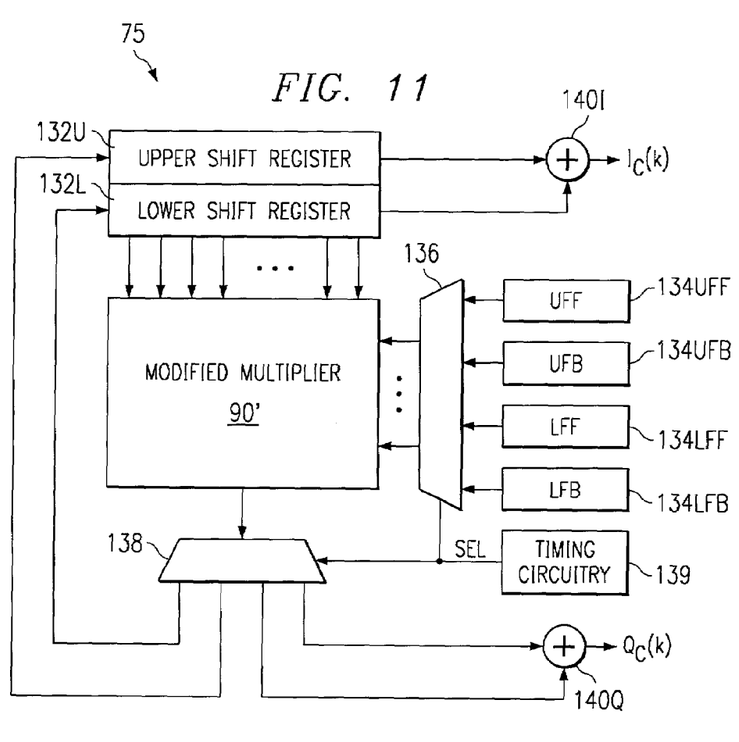
FIG. 11 is an electrical diagram, in block form, of a scrambling code generator circuit according to the preferred embodiment of the invention.

Referring now to FIG. 11, the construction of scrambling code generator 75 according to this embodiment of the invention will now be described in detail. The function of scrambling code generator 75 is to produce a scrambling code in the same conventional way, from a data flow standpoint, as that shown in FIG. 2 and discussed above in the Background of the Invention. According to this embodiment of the invention, however, this code generation is performed using modified multiplier circuit 90', and thus attains important improvement in chip area efficiency and in performance.

Modified multiplier circuit 90' in scrambling code generator 75 according to this embodiment of the invention is constructed similarly as described above for modified multiplier circuit 90 of convolutional coding function 60. As shown in FIG. 11, modified multiplier circuit 90' has a control input coupled to line MPY/ENCODE_, which controls the selection of either a conventional multiplier mode in which carries are used, or a coding mode as described above in which each adder is blocked from considering carries, and thus executes exclusive-OR functions as required in the code generating algorithm of scrambling code generator 75. Because of the difference in function, however, it is contemplated that the dimensions of modified multiplier circuit 90' will differ from those in convolutional coding function 60. An example of the size of modified multiplier circuit 90' in scrambling code generator 75 is contemplated to be sixteen rows by thirty-two columns, at a minimum.

As shown in FIG. 11, upper shift register 132U and lower shift register 132L provide inputs to modified multiplier circuit 90'. Shift registers 132 each correspond to a sequence of shift register stages, corresponding to delay stages D described above, with an output produced from the input to the first stage, and from the output of each of the other stages. Referring to FIG. 11 in combination with FIG. 2, upper shift register 132U of scrambling code generator 75 corresponds to delay stage sequence 15I of scrambling code generator 10 of FIG. 2, and lower shift register 132L corresponds to delay stage sequence 15Q.

Modified multiplier circuit 90' performs the feedback and feedforward exclusive-OR operations used in generating the scrambling code according to this embodiment of the invention. These operations performed by modified multiplier circuit 90' correspond to exclusive-OR functions 12, 14, 16, 18 in scrambling code generator 10 of FIG. 2. According to this implementation, a single modified multiplier circuit 90' is provided that will serially perform these four operations. Four sets of coefficients for controlling the selection of the shift register stages to be exclusive-ORed, and the routing of the four results, must therefore be controlled to use this single modified multiplier circuit 90', as will be described below. Alternatively, however, it is contemplated that multiple modified multiplier circuits 90' may be provided to perform these operations in parallel, rather than in sequence, to attain higher performance but at a cost of additional circuitry and chip area. It is contemplated that those skilled in the art having reference to this specification will be readily able to optimize the selection of the number of modified multiplier circuits 90' for each particular application.

The use of modified multiplier circuit 90' to effect the feedback exclusive-OR functions 14, 18 of FIG. 2 is limited, in that output bits are not reused in the same cycle within the multiplier array and therefore require multiple cycles as they are calculated to produce the full result. If this constraint cannot be met for the feedback operations, one may use a modified multiplier architecture according to this invention for the feed-forward direction only, with conventional combinatorial logic used for the feedback operations.

Returning to FIG. 11, four coefficient registers 134 are provided for storing the coefficients selecting the shift register stages to be exclusive-ORed in each operation. Coefficient register 134UFF stores the feed-forward coefficients operating upon the contents of upper shift register 132U, coefficient register 134UFB stores the feedback coefficients operating upon the contents of upper shift register 132U; similarly, coefficient registers 134LFF, 134LFB store the feed-forward and feedback coefficients, respectively, that operate upon the contents of lower shift register 132L. In this example, the control of the application of the sets of coefficients is effected by multiplexer 136, which is controlled by a control signal on lines SEL from timing circuit 139 according to the timing of the scrambling code generation.

As shown in FIG. 2, four result bits are generated by exclusive-OR functions 12, 14, 16, 18 in the producing of a scrambling code. The four operations of modified multiplier circuit 90' similarly produce four result bits, one for each of the feed-forward and feedback operations for each of upper and lower shift registers 132U, 132L. Demultiplexer 136 forwards these four results to the appropriate destination for the operation, under the control of timing circuit 139 via control lines SEL. In this example, which corresponds to the example of FIG. 2, the results of the feed-forward exclusive-ORs of the contents of each of upper and lower shift registers 132U, 132L are applied to corresponding inputs of exclusive-OR function 140Q to produce quadrature code component $Q_c(k)$. The result of the feedback exclusive-OR of the contents of upper shift register 132U is applied to the input of upper shift register 132U, and the result of the feedback exclusive-OR of lower shift register is applied to the input of lower shift register 132L. In-phase scrambling code component $I_c(k)$ is produced, as before, by the exclusive-OR of the last stages of upper and lower shift registers 132U, 132L. It is contemplated that each of the inputs to exclusive-OR functions 140I, 140Q, and perhaps also to upper and lower shift registers 132U, 132L, are latched, considering that the results of the exclusive-OR operations performed by modified multiplier circuitry 90' are obtained sequentially rather than simultaneously.

In an example of the operation of scrambling code generator 75, the states of the last stages of upper and lower shift registers 132U, 132L are applied to exclusive-OR function 1401, to produce the current in-phase scrambling code component $I_c(k)$. This operation may take place at any time during the current sequence of operations, prior to the shifting of the contents of shift registers 132. The sequence of exclusive-OR operations begins with the presentation of the contents of upper shift register 132U to modified multiplier circuit 90'. Under the control of timing circuit 139, multiplexer 136 applies the contents of register 134UFF to modified multiplier circuit 90', and demultiplexer 138 couples the output of modified multiplier circuit 90' to an input of exclusive-OR function 140Q. Modified multiplier circuit 90' performs the selected exclusive-ORs of the contents of upper shift register 132U, with the result forwarded to an input of exclusive-OR function 140Q.

Next, feedback coefficients from register 134UFB are presented to modified multiplier circuit 90' by multiplexer 136; demultiplexer 138 also couples the output of modified multiplier circuit 90' to the input of the first stage of upper shift register 132U. The contents of upper shift register 132U remain applied to modified multiplier circuit 90'. Modified multiplier circuit 90' generates the result bit according to the exclusive-OR functions indicated by the coefficients in register 134UFB, and applies this result to upper shift register 132U.

Operations using the contents of lower shift register 132L are now performed. Multiplexer 136 selects register 134LFF for application to modified multiplier circuit 90', and demultiplexer 138 couples the output of modified multiplier circuit 90' to the corresponding input of exclusive-OR function 140Q. Modified multiplier circuit 90' performs the exclusive-OR operation indicated by the coefficients of register 134LFF, to generate the corresponding input to the generation of quadrature scrambling code component $Q_c(k)$. Following this operation, multiplexer 136 selects register 134LFB for application to modified multiplier circuit 90', and demultiplexer 138 couples the output of modified multiplier circuit 90' to the input of the first stage of lower shift register 132L. The contents of lower shift register 132L remain applied to modified multiplier circuit 90', which then generates the next bit in the sequence from the exclusive-OR operation indicated by register 134LFB.

Once all four of the operations of modified multiplier circuit 90' are complete, exclusive-OR functions 140I, 140Q can then produce and forward the current values of the in-phase and quadrature scrambling code components $I_c(k)$, $Q_c(k)$, for application to the current data components $I(k)$, $Q(k)$ by bit modulator circuitry 72 (FIG. 10). Execution of the operations can then be repeated for the next set of values.

Referring back to FIG. 5, the outputs of bit modulator circuitry 72 in each of encode and modulate functions 55 are then forwarded for transmission, for example as a single multiplexed datastream after multiplexing by multiplexer 74.

According to this embodiment of the invention, therefore, the modified multiplier architecture can be used in the exclusive-OR functions applied in the generation of conventional scrambling codes, such as those cell-specific codes used in modern wireless voice and data communications. This architecture provides the important benefits of great flexibility in the selection of the particular code, for example simply by reloading the registers storing the sets of coefficients, while providing efficient circuitry for carrying out the exclusive-OR operations, both in performance and in chip area. In addition, the modified multiplier architecture can be implemented in such a way that the same circuit can be used, in one mode, to execute a conventional digital multiplication, and in another mode to perform the exclusive-OR operations used in the encoding and code generation operations. This dual function provides the additional advantage of further chip efficiency, in that the same relatively large logic circuit can be used for multiple functions.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A coding circuit, comprising:
    a sequence of delay stages, for storing successive states of a datastream;
    a first code register, for storing a plurality of bits having states corresponding to a first set of code generator polynomial coefficients;
    at least one additional code register, for storing a plurality of bits having states corresponding to at least one additional set of code generator polynomial coefficients; and
    a code register multiplexer, for selecting one of the code registers;
    a parallel multiplier, comprising a plurality of adder units arranged in rows, each row associated with one of the plurality of bits of the first code register, and each adder unit comprising:
        a first logic gate for selectively applying a corresponding one of the successive states of the datastream responsive to a corresponding bit of the selected code register; and
        an adder for adding a sum bit from an adder unit in a previous row with an output of the first logic gate;
    wherein selected outputs of the adder units in a last row of the parallel multiplier provide an encoded output of the coding circuit.

2. The coding circuit of claim 1, wherein the sequence of delay stages is arranged in a shift register.

3. The coding circuit of claim 1, wherein each adder unit further comprises:
    a second logic gate for selectively applying, to the adder, of a carry-out from an adjacent adder unit responsive to the state of a control signal.

4. A coding circuit for generating a scrambling code comprising:
    a sequence of delay stages arranged in first and second sequences, for storing successive states of a datastream;
    a first code register, for storing a plurality of bits having states corresponding to a first set of code generator polynomial coefficients;
    a second code register, for storing a plurality of bits having states corresponding to a second set of code generator polynomial coefficients, the first code register storing coefficients corresponding to a first feed-forward combination associated with the first sequence of delay stages, and the second code register storing coefficients corresponding to a second feed-forward combination associated with the second sequence of delay stages;
    a code register multiplexer, for selecting one of the code registers;

a parallel multiplier, comprising a plurality of adder units arranged in rows, each row associated with one of the plurality of bits of the first code register, and each adder unit comprising:
  a first logic gate for selectively applying a corresponding one of the successive states of the datastream responsive to a corresponding bit of the selected code register; and
  an adder for adding a sum bit from an adder unit in a previous row with an output of the first logic gate;

an output demultiplexer, for coupling an output of the parallel multiplier to a selected node;

an in-phase exclusive-OR function, having inputs coupled to a last one of the delay stages of each of the first and second sequences, for generating an in-phase scrambling code component;

a quadrature exclusive-OR function, having inputs coupled to respective outputs of the output demultiplexer, for generating a quadrature scrambling code component; and feedback logic, coupled to the first and second sequences of delay stages, for generating and applying a feedback value to a first one of the delay stages of each of the first and second sequences of delay stages;

wherein selected outputs of the adder units in a last row of the parallel multiplier provide an encoded output of the coding circuit.

5. The coding circuit of claim 4, wherein the feedback logic comprises:
  a third code register, for storing a plurality of bits having states corresponding to a third set of code generator polynomial coefficients, the third code register storing coefficients corresponding to a first feedback combination associated with the first sequence of delay stages;
  a fourth code register, for storing a plurality of bits having states corresponding to a fourth set of code generator polynomial coefficients, the fourth code register storing coefficients corresponding to a second feedback combination associated with the second sequence of delay stages;
  wherein the output demultiplexer also has outputs coupled to the first delay stage in each of the first and second sequences of delay stages, for selectably coupling feedback values from the parallel multiplier to the first delay stage of the first and second sequences of delay stages.

6. A broadband wireless communications device, comprising:
  an antenna;
  a radio subsystem, coupled to the antenna, for amplifying signals to be transmitted from the antenna;
  encode and modulate logic, coupled to the radio subsystem, for encoding digital signals to be transmitted, comprising:
    convolution coding logic, for applying a convolution code to at least one datastream corresponding to a subchannel in a broadband spectrum, and comprising:
      a sequence of delay stages, for storing successive states of a datastream;
      a plurality of code registers, each for storing a plurality of bits having states corresponding to a set of code generator polynomial coefficients;
      a code multiplexer for selecting one of the plurality of code registers;
      a parallel multiplier, comprising a plurality of adder units arranged in rows, each row associated with one of the plurality of bits of the selected code register, and each adder unit comprising:
        a first logic gate for selectively applying a corresponding one of the successive states of the datastream responsive to a corresponding bit of the first code register; and
        an adder for adding a sum bit from an adder unit in a previous row with an output of the first logic gate, selected outputs of the adder units in a last row of the parallel multiplier providing an encoded output of the coding circuit; and
    a spread and modulate function, for spreading the encoded datastream into a modulated broadband signal to be forwarded to the radio subsystem.

7. The device of claim 6, wherein the sequence of delay stages is arranged in a shift register.

8. The device of claim 6, wherein the spread and modulate function spreads the encoded datastream into in-phase and quadrature components.

9. The device of claim 8, wherein the spread and modulate function comprises:
  a long code and spreading logic function;
  a scrambling code generator, for generating a scrambling code having in-phase and quadrature components; and
  bit modulator circuitry, for modulating each of the in-phase and quadrature components of the encoded datastream with the in-phase and quadrature components, respectively, of the scrambling code.

10. The device of claim 9, wherein the scrambling code generator comprises:
  first and second sequences of delay stages, for storing successive states of first and second codestreams;
  a first code register, for storing a plurality of bits having states corresponding to a first feed-forward combination associated with the first sequence of delay stages;
  a second code register, for storing a plurality of bits having states corresponding to a second feed-forward combination associated with the second sequence of delay stages;
  a code register multiplexer, for selecting one of the code registers;
  a parallel multiplier, comprising a plurality of adder units arranged in rows, each row associated with one of the plurality of bits of the first code register, and each adder unit comprising:
    a first logic gate for gating the application of a corresponding one of the successive states of the datastream responsive to a corresponding bit of the selected code register; and
    an adder for adding a sum bit from an adder unit in a previous row with the output of the first logic gate, selected ones of the outputs of the adder units in a last row of the parallel multiplier provide an encoded output of the coding circuit;
  an output demultiplexer, for coupling a selected output of one of the adder units in a last row of the parallel multiplier to a selected node;
  an in-phase exclusive-OR function, having inputs coupled to a last one of the delay stages of each of the first and second sequences, for generating an in-phase scrambling code component value;
  a quadrature exclusive-OR function, having inputs coupled to respective outputs of the output demultiplexer, for generating a quadrature scrambling code component value; and
  feedback logic, coupled to the first and second sequences of delay stages, for generating and applying a feedback value to a first one of the delay stages of each of the first and second sequences of delay stages.

11. The device of claim 10, wherein the feedback logic of the scrambling code generator comprises:
   a third code register, for storing a plurality of bits having states corresponding to a third set of code generator polynomial coefficients, the third code register storing coefficients corresponding to a first feedback combination associated with the first sequence of delay stages;
   a fourth code register, for storing a plurality of bits having states corresponding to a fourth set of code generator polynomial coefficients, the fourth code register storing coefficients corresponding to a second feedback combination associated with the second sequence of delay stages;
   wherein the output demultiplexer also has outputs coupled to the first delay stage in each of the first and second sequences of delay stages, for selectably coupling feedback values from the parallel multiplier to the first delay stage of the first and second sequences of delay stages.

12. The device of claim 10, wherein each adder unit in the scrambling code generator further comprises:
   a second logic gate for gating the application, to the adder, of a carry-out from an adjacent adder unit responsive to the state of a control signal.

13. The device of claim 6, wherein each adder unit further comprises:
   a second logic gate for selectively applying, to the adder, of a carry-out from an adjacent adder unit responsive to the state of a control signal.

* * * * *